(12) United States Patent
Seyama et al.

(10) Patent No.: US 12,341,035 B2
(45) Date of Patent: Jun. 24, 2025

(54) MOUNTING DEVICE

(71) Applicant: SHINKAWA LTD., Tokyo (JP)

(72) Inventors: Kohei Seyama, Tokyo (JP); Tetsuya Utano, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 606 days.

(21) Appl. No.: 17/603,938

(22) PCT Filed: Apr. 13, 2020

(86) PCT No.: PCT/JP2020/016294
§ 371 (c)(1),
(2) Date: Oct. 14, 2021

(87) PCT Pub. No.: WO2020/213567
PCT Pub. Date: Oct. 22, 2020

(65) Prior Publication Data
US 2022/0216078 A1 Jul. 7, 2022

(30) Foreign Application Priority Data

Apr. 15, 2019 (JP) ................................. 2019-076886

(51) Int. Cl.
*B23P 19/00* (2006.01)
*B25J 9/12* (2006.01)
(Continued)

(52) U.S. Cl.
CPC .......... *H01L 21/67144* (2013.01); *B25J 9/12* (2013.01); *B25J 13/088* (2013.01);
(Continued)

(58) Field of Classification Search
CPC ............... H01L 21/52; H01L 21/67132; H01L 21/67144; H01L 21/6838; B25J 13/04;
(Continued)

(56) References Cited

U.S. PATENT DOCUMENTS 7,103,967 B2 * 9/2006 Nakagawa ........ H01L 21/67144
83/591
10,497,590 B2 12/2019 Seyama
(Continued)

FOREIGN PATENT DOCUMENTS

JP   H09283990   10/1997
JP   H11297764   10/1999
(Continued)

OTHER PUBLICATIONS

"International Search Report (Form PCT/ISA/210) of PCT/JP2020/016294," mailed on May 26, 2020, with English translation thereof, pp. 1-4.
(Continued)

*Primary Examiner* — Paul D Kim
(74) *Attorney, Agent, or Firm* — JCIPRNET

(57) ABSTRACT

A mounting device 1 is equipped with: two direct-acting voice coil motors 38 in which a movable element 38c reciprocatingly moves along an axis A relative to a fixed element 38b; and a collet 34A mounted on an end part side of the movable elements 38c, the collet 34A holding a semiconductor chip 101 by suction. The plurality of voice coil motors 38 are disposed so as to be set away from each other along a direction intersecting the axes A, and in a manner that the axes A are parallel to each other. The collet 34A is mounted so as to straddle chucks 39 provided at the end parts of the two movable elements 38c.

4 Claims, 6 Drawing Sheets

(51) Int. Cl.
    *B25J 13/08*     (2006.01)
    *B25J 15/06*     (2006.01)
    *H01L 21/67*     (2006.01)
    *H05K 13/04*     (2006.01)
    *H01L 21/683*     (2006.01)

(52) U.S. Cl.
    CPC ..... *B25J 15/0616* (2013.01); *H01L 21/67132* (2013.01); *H01L 21/6838* (2013.01)

(58) Field of Classification Search
    CPC . B25J 13/088; B25J 9/0084; B25J 9/12; B25J 15/0441; B25J 15/0466; B25J 15/0616
    See application file for complete search history.

(56) References Cited

U.S. PATENT DOCUMENTS

| | | | | |
|---|---|---|---|---|
| 2006/0119118 A1* | 6/2006 | Hata | ............... | H05K 13/0409 294/64.2 |
| 2010/0220183 A1* | 9/2010 | Yoro | ............... | H01L 21/681 348/86 |
| 2015/0282398 A1* | 10/2015 | Kawaguchi | ........ | H05K 13/0413 29/740 |
| 2018/0035579 A1* | 2/2018 | Nishiyama | ......... | H05K 13/0409 |
| 2019/0006211 A1 | 1/2019 | Seyama | | |

FOREIGN PATENT DOCUMENTS

| | | | |
|---|---|---|---|
| JP | 2005117003 A | * | 1/2005 |
| JP | 2007200914 | | 8/2007 |
| JP | 2017041532 | | 2/2017 |
| KR | 101044622 | | 6/2011 |
| WO | 2011079956 | | 7/2011 |
| WO | 2017119216 | | 7/2017 |

OTHER PUBLICATIONS

Office Action of China Counterpart Application, with partial English translation thereof, issued on May 17, 2024, pp. 1-11.

"Office Action of China Counterpart Application", issued on Sep. 30, 2024, with English translation thereof, p. 1-p. 9.

"Decision of Rejection of China Counterpart Application", with partial English translation thereof, issued on Jan. 16, 2025, pp. 1-13.

* cited by examiner

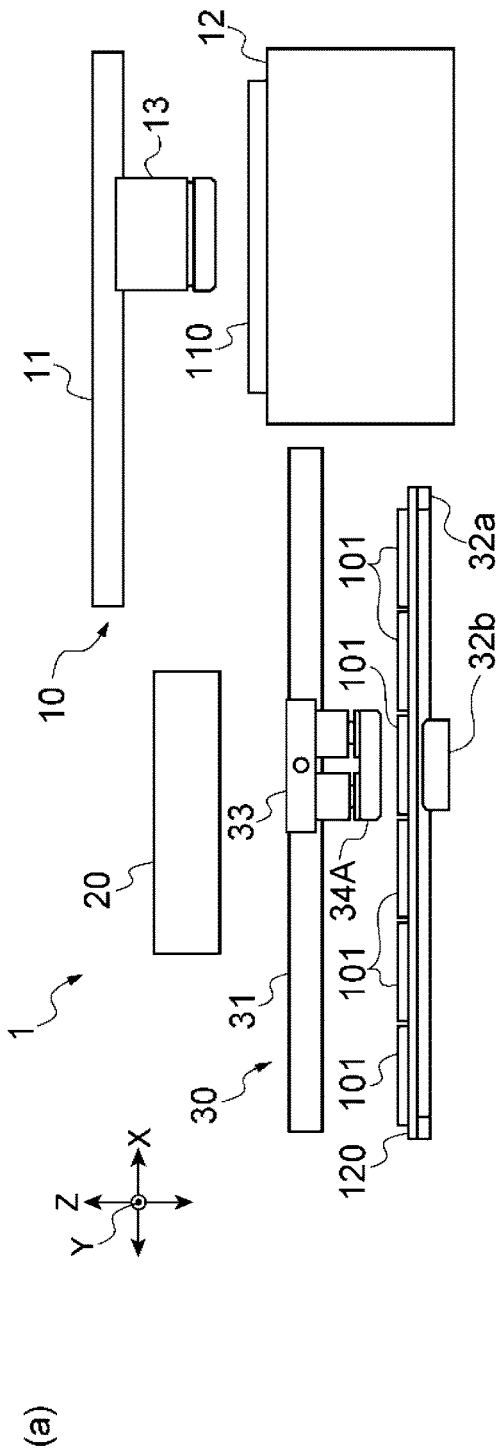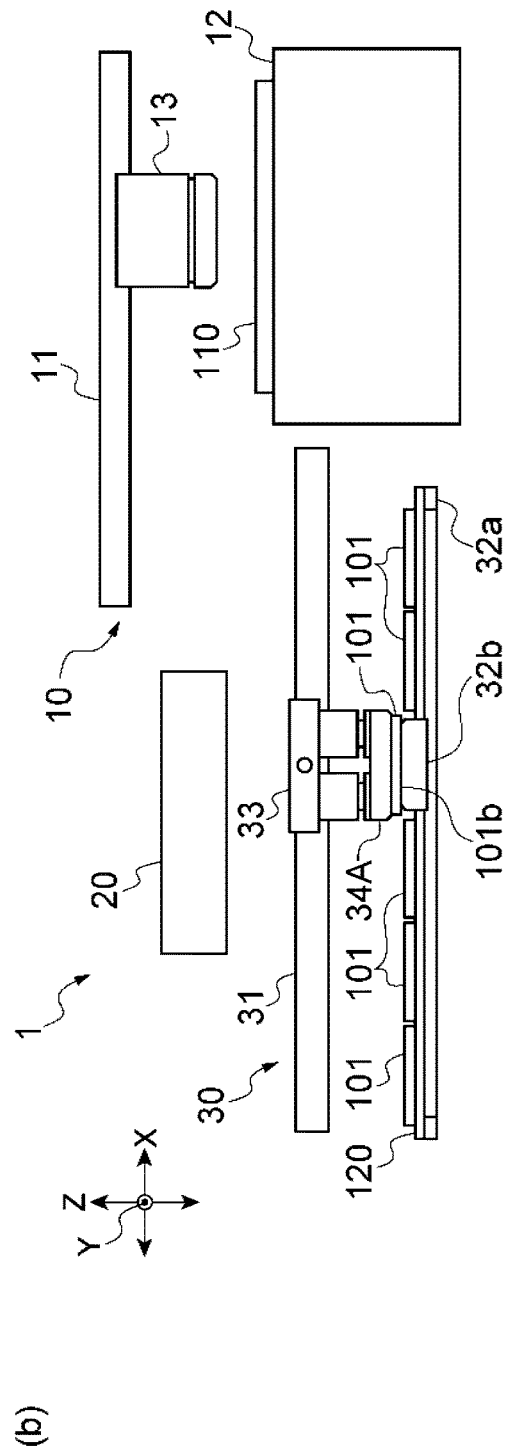
FIG. 4

MOUNTING DEVICE

CROSS-REFERENCE TO RELATED APPLICATION

This application is a 371 application of the International PCT application serial no. PCT/JP2020/016294, filed on Apr. 13, 2020, which claims the priority benefits of Japan Patent Application No. 2019-076886, filed on Apr. 15, 2019. The entirety of each of the above-mentioned patent applications is hereby incorporated by reference herein and made a part of this specification.

TECHNICAL FIELD

The disclosure relates to a mounting device.

BACKGROUND ART

A semiconductor chip which is a fragment of a semiconductor wafer is a component of an electronic device. A manufacturing process of the electronic device involves the work of picking up semiconductor chips and the work of arranging the semiconductor chips on circuit boards. Patent Literature 1 discloses a handling unit for electronic components. This handling unit reverses the directions of two held semiconductor chips. Further, this handling unit also changes the arrangement directions of two semiconductor chips.

CITATION LIST

Patent Literature

[Patent Literature 1]
International Publication No. WO 2017/119216

SUMMARY OF INVENTION

Technical Problem

With the diversification of the electronic device, the shape of the semiconductor chip is also diversifying. For example, the shape of the semiconductor chip includes a rectangular parallelepiped shape and a thin plate shape. When the chip thickness is sufficient for the area of a chip main surface like the rectangular parallelepiped shape, the semiconductor chip has a relatively high mechanical strength. In this case, the semiconductor chip is easily handled. On the other hand, when the chip thickness for the area of the chip main surface is small like the thin plate shape, the mechanical strength of the semiconductor chip tends to be low. In this case, it is necessary to carefully handle the semiconductor chip.

Further, in recent years, the need for high-mix production has increased. Thus, it is desired that a manufacturing apparatus is not specialized in handling a specific component but can handle a variety of components. For example, a mounting device is required to handle not only a semiconductor chip having sufficient strength but also a semiconductor chip having low strength.

Furthermore, there is a demand for larger semiconductor chips. At the time of picking up the large semiconductor chips, it is necessary to suck the entire surface of the semiconductor chip with a collet in order to suppress the damage of the semiconductor chip. A large collet is required when sucking the entire surface of the semiconductor chip. Since the weight of the large collet increases, there is a problem that the thrust of a motor that moves the collet is insufficient.

The disclosure provides a mounting device capable of handling semiconductor chips of various shapes.

Solution to Problem

A mounting device of an aspect of the disclosure includes: a plurality of direct-acting motors in which a movable element reciprocatingly moves along an axis relative to a fixed element; and a chip holder which is attached to an end portion side of the movable element and sucks and holds a semiconductor chip, wherein the plurality of motors are arranged so that the axes are parallel to each other, and wherein the chip holder is attached to straddle end portion sides of at least two movable elements in the plurality of movable elements.

This device includes two motors capable of attaching and detaching the chip holder. According to this configuration, two different modes can be selected. As a first mode, a mode in which one chip holder is attached to straddle at least two motors can be selected. The chip holder which is disposed to straddle between the motors is driven by at least two motors. Thus, the chip holder can be made larger than the chip holder driven by one motor. That is, the area of the holding surface of the chip holder can be increased. As a result, the larger semiconductor chip can be held. That is, the thin semiconductor chip can be carried. Further, as a second mode, a mode in which a chip holder is attached to each of the motors can be selected. According to this mode, the small semiconductor chip can be carried. As a result, the mounting device capable of selecting the first mode and the second mode can handle the semiconductor chips of various shapes.

In an aspect, the mounting device may further include a control unit which provides a control signal to the motor to control the position of the fixed element. The motor may include a position information acquiring unit which obtains a position along the axis of the movable element relative to the fixed element. The control unit may acquire representative position information from the position information acquiring unit of a representative motor selected from the plurality of motors and control the positions of the movable elements of the plurality of motors using the representative position information. According to such a configuration, the position of the movable element of the representative motor can be simply controlled with high accuracy. Thus, the position of the chip holder can be simply controlled with high accuracy.

In an aspect, the motor may be a voice coil motor. According to this configuration, a driving force for driving the chip holder can be preferably obtained.

In an aspect, the motor may include a chuck which is provided at an end portion of the movable element and to which the chip holder is connected in an attachable and detachable manner. The chuck may include a chuck mechanism which connects the chip holder to the chuck and a chuck detector which detects whether or not the chip holder exists in the chuck. According to this chuck, the chip holder can be easily attached to and detached from the movable element. Further, it is possible to obtain information indicating that the chip holder is attached to the movable element and information indicating that the chip holder is not attached to the movable element.

In an aspect, the semiconductor chip may include a chip held surface which is held by the chip holder. The chip holder may include a chip holding surface which holds the semiconductor chip in an attachable and detachable manner. An area of the chip holder may be larger than an area of the chip held surface. According to such a configuration, the thin semiconductor chip can be reliably held.

In an aspect, the semiconductor chip may include a chip held surface which is held by the chip holder. The mounting device may further include a push-up mechanism which pushes a surface on the side opposite to the chip held surface and pushes up the semiconductor chip toward the chip holder. According to such a configuration, the chip holder can reliably pick up the semiconductor chip.

Advantageous Effects of Invention

According to the mounting device of an aspect of the disclosure, the semiconductor chips of various shapes can be handled.

Part (a) and part (b) of FIG. 4 are diagrams illustrating an operation of the mounting device.

Figure 5:
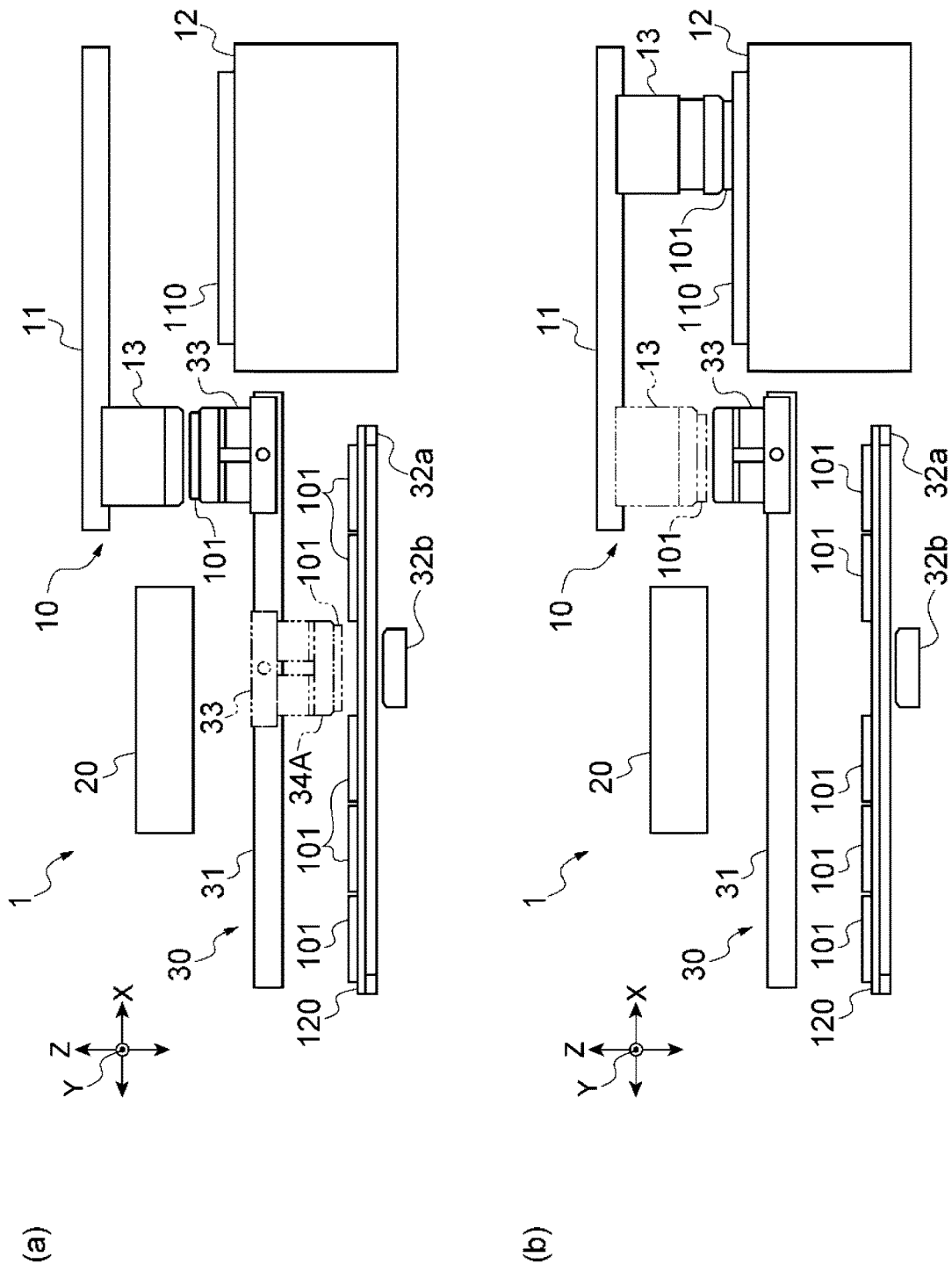

Part (a) and part (b) of FIG. 5 are diagrams further illustrating the operation of the mounting device.

Figure 6:
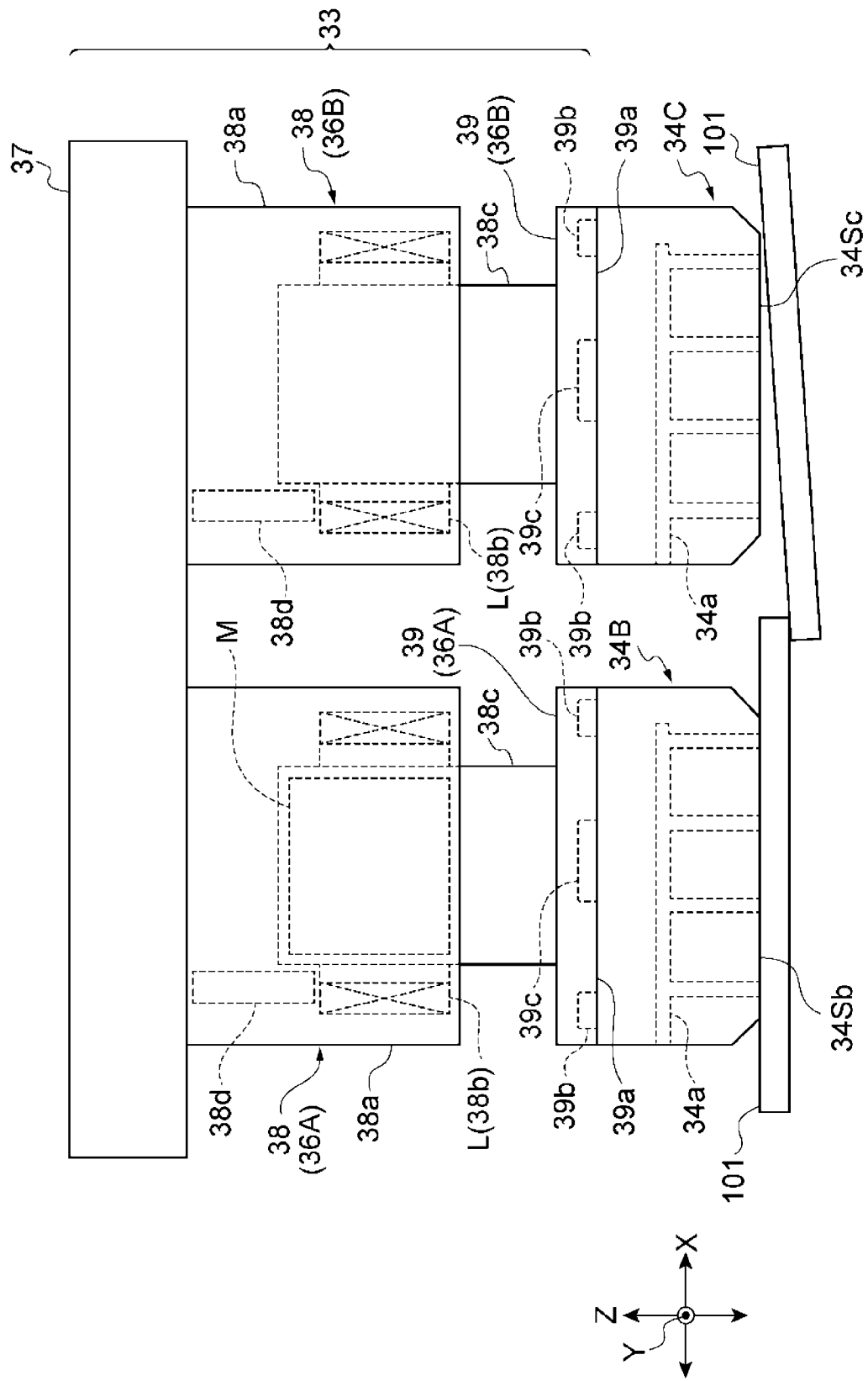

FIG. 6 is a diagram illustrating an effect of the mounting device.

DESCRIPTION OF EMBODIMENTS

Hereinafter, a mode for carrying out the disclosure will be described with reference to the accompanying drawings. In the description of the drawings, the same elements are designated by the same reference numerals, and duplicate description will be omitted.

Figure 1:
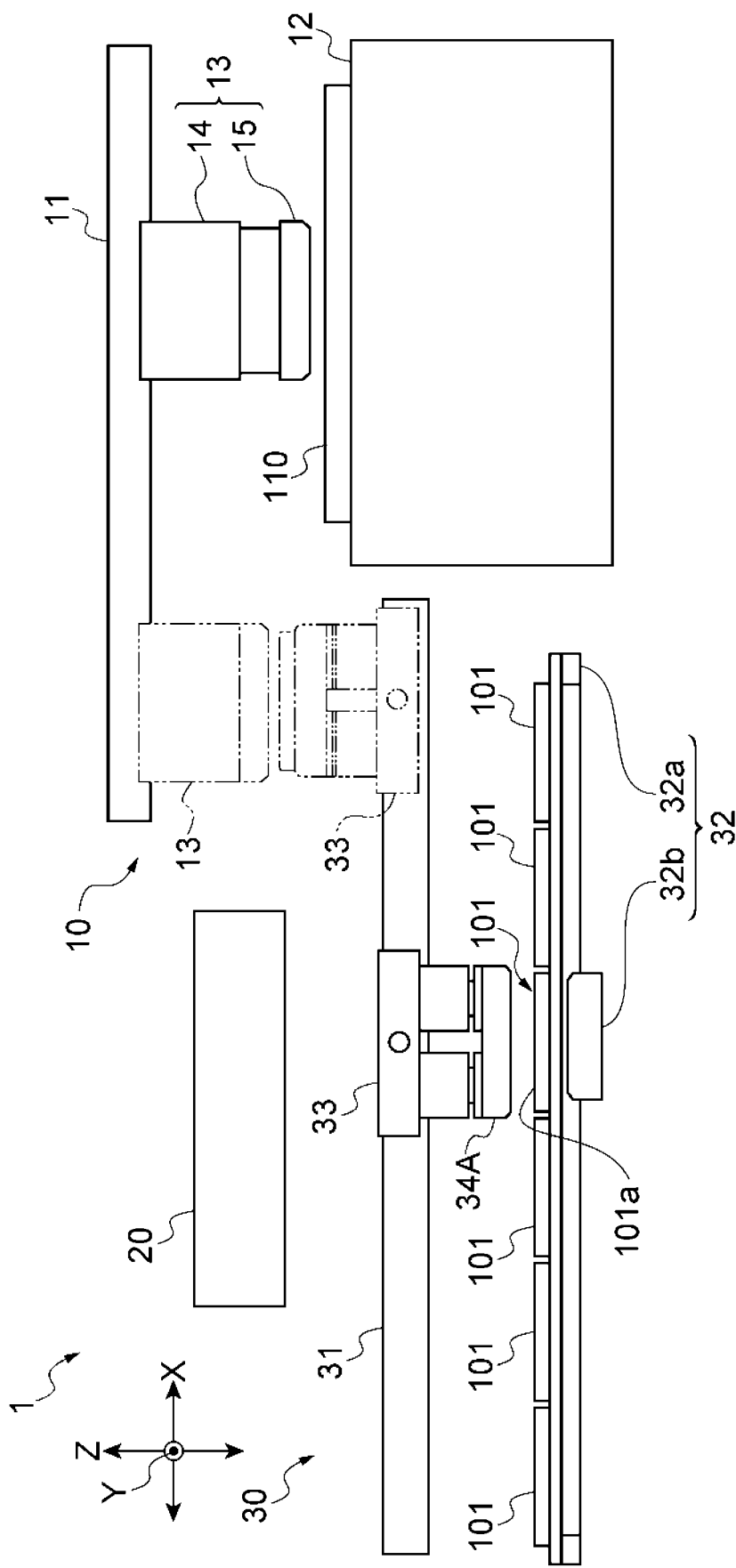
FIG. 1 is a diagram showing a mounting device of an embodiment.

As shown in FIG. 1, a mounting device 1 mounts a semiconductor chip 101 on a substrate 110. The mounting device 1 includes a bonding unit 10, a control unit 20 (control unit), and a pickup unit 30. The pickup unit 30 picks up the semiconductor chip 101. The pickup unit 30 sucks a chip main surface 101a (chip held surface) of the semiconductor chip 101. Next, the pickup unit 30 passes the semiconductor chip 101 to the bonding unit 10. The bonding unit 10 bonds the received semiconductor chip 101 to the substrate 110. The control unit 20 controls the operation of the pickup unit 30 and the operation of the bonding unit 10.
<Bonding Unit>

The bonding unit 10 includes a guide rail 11, a bonding stage 12, and a bonding head 13.

The guide rail 11 is a base body for reciprocating the bonding head 13 in a predetermined direction. The guide rail 11 extends from, for example, the pickup unit 30 over an area in which a bonding operation is performed.

The supplied substrate 110 is placed on the bonding stage 12. The semiconductor chip 101 is mounted on the substrate 110 placed on the bonding stage 12. The bonding stage 12 has, for example, a suction hole. The bonding stage 12 sucks the substrate 110 and holds the substrate from below.

The bonding head 13 includes a bonding body 14 and a bonding nozzle 15. The bonding body 14 is connected to the guide rail 11. The bonding body 14 reciprocatingly moves along the guide rail 11. The bonding body 14 includes a motor for driving the bonding nozzle 15.

The bonding nozzle 15 holds the semiconductor chip 101 in an attachable and detachable manner. For example, the bonding nozzle 15 includes a vacuum suction mechanism as an attachment and detachment mechanism. Further, the bonding nozzle 15 bonds the semiconductor chip 101 to the substrate 110. For example, the bonding nozzle 15 may include a heater or the like and supply heat to the semiconductor chip 101.
<Pickup Unit>

The pickup unit 30 includes a guide rail 31, a wafer operation mechanism 32, and a pickup head 33.

The guide rail 31 is a base body for reciprocating the pickup head 33 in a predetermined direction. The guide rail 31 extends from, for example, an area in which a picking operation is performed to the bonding unit 10.

The wafer operation mechanism 32 assists a pickup operation. The wafer operation mechanism 32 includes a wafer holder 32a and a push-up pin 32b. The wafer holder 32a and the push-up pin 32b move relatively to each other. As a result, the wafer operation mechanism 32 can dispose the push-up pin 32b on the back surface side of the semiconductor chip 101 to be picked up. For example, the wafer holder 32a is movable in the Y direction. The push-up pin 32b is movable in the X direction. Further, the wafer holder 32a may be movable in the X direction and the Y direction. According to this configuration, the push-up pin 32b can be disposed on a back surface side of an arbitrary semiconductor chip 101 in the plurality of semiconductor chips 101 arranged in two dimensions. Then, the push-up pin 32b pushes up the semiconductor chip 101 toward the pickup head 33. That is, the push-up pin 32b is reciprocatingly movable in the Z direction.

Figure 2:
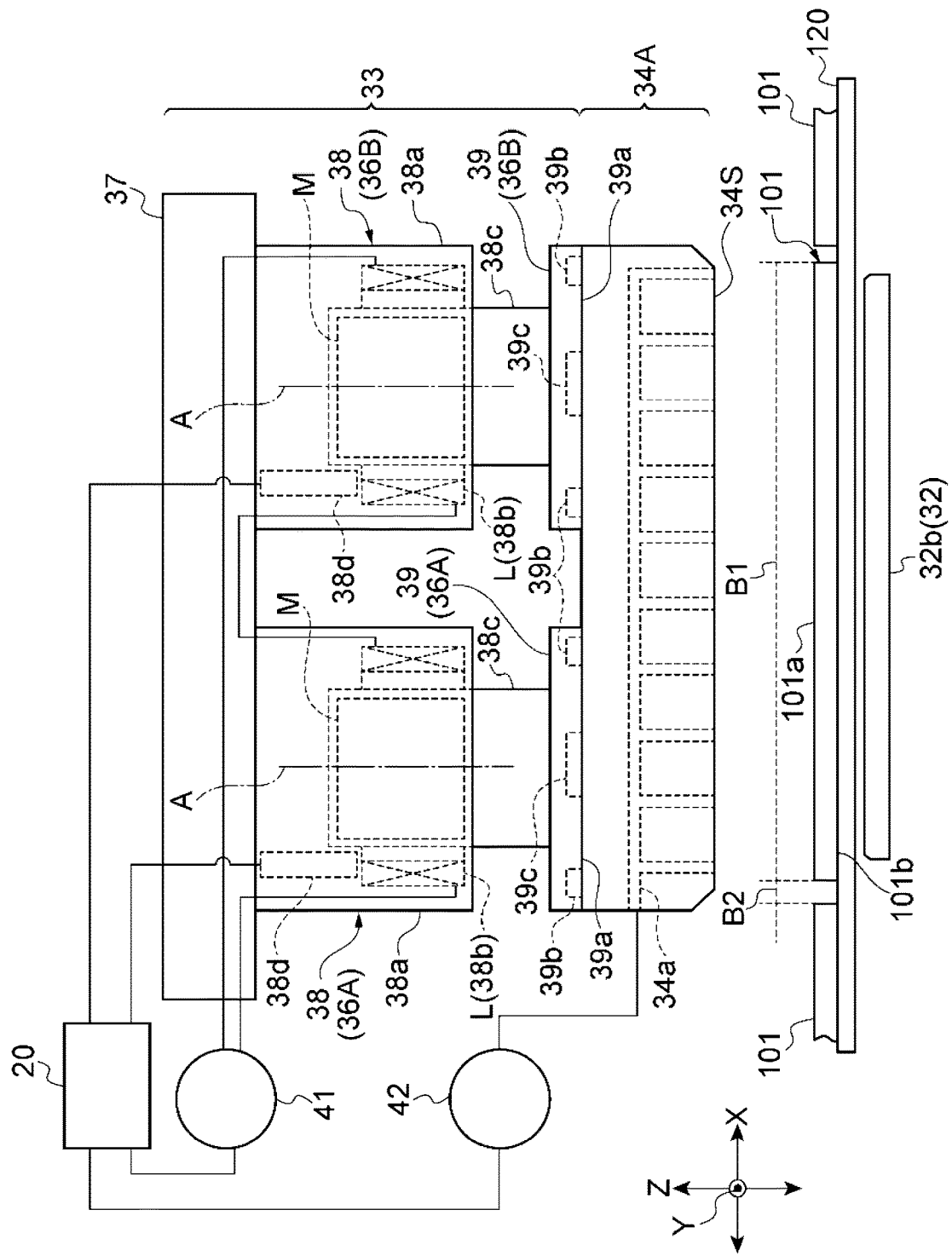
FIG. 2 is a diagram illustrating a first mode of a pickup head.

As shown in FIG. 2, the pickup head 33 includes two pickup motors 36A and 36B (motors), a motor base 37, and a collet 34A (chip holder). Each of the pickup motors 36A and 36B is fixed to the motor base 37. The pickup motors 36A and 36B are arranged to be separated from each other in the direction (X direction) orthogonal to the axis A. According to such an arrangement, the axis A of the pickup motor 36A is parallel to the axis A of the pickup motor 36B. The gap from the pickup motor 36A to the pickup motor 36B may be based on, for example, the dimension B1 of the semiconductor chip 101 and/or the arrangement interval B2 of the semiconductor chip 101.

The pickup motor 36B is only different in arrangement from the pickup motor 36A. The configuration of the pickup motor 36B is common to the configuration of the pickup motor 36A. Hereinafter, the pickup motor 36A will be described in detail and the description of the pickup motor 36B will be omitted.

The pickup motor 36A includes a voice coil motor 38 and a chuck 39. The voice coil motor 38 is a so-called direct-acting linear motor. The voice coil motor 38 reciprocatingly moves the chuck 39 in the Z direction. The voice coil motor 38 includes a motor casing 38a, a fixed element 38b, and a movable element 38c. The motor casing 38a accommodates the fixed element 38b. Further, the motor casing 38a accommodates the base end side of the movable element 38c. The fixed element 38b includes a coil L. The movable element 38c includes a magnet M. The magnet M is provided in a portion facing the coil L in the movable element 38c. A power supply 41 is connected to the coil L. The coil L generates a force for driving the movable element 38c in response to a current supplied from the power supply 41.

Here, the connection configuration of the coil L will be described. The coil L of the pickup motor 36A and the coil L of the pickup motor 36B receive a current supplied from the common power supply 41. That is, the coil L of the pickup motor 36A is electrically connected to the coil L of the pickup motor 36B. For example, two coils L may be connected in series to each other. Further, two coils L may be connected in parallel to each other.

The front end of the movable element 38c protrudes from the motor casing 38a. The front end of the movable element 38c is provided with the chuck 39. The chuck 39 holds the collet 34A in an attachable and detachable manner. The chuck 39 includes a chuck holding surface 39a, a chuck magnet 39b (chuck mechanism), and a chuck sensor 39c (chuck detector). The shape of the chuck holding surface 39a is, for example, a rectangular plane in the plan view. The chuck magnet 39b is embedded in the chuck 39. The chuck magnet 39b provides a magnetic force for holding the collet 34A. The chuck sensor 39c provides information indicating that the collet 34A is mounted on the chuck holding surface 39a. Further, the chuck sensor 39c provides information indicating that the collet 34A is not mounted on the chuck holding surface 39a. The chuck sensor 39c may provide information indicating that the collet 34A is mounted on the chuck holding surface 39a. Further, the chuck sensor 39c may provide information indicating that the collet 34A is not mounted on the chuck holding surface 39a. This information is provided to the control unit 20. Additionally, the chuck mechanism is not limited to one that holds the collet 34A by the chuck magnet 39b. The chuck mechanism may be a mechanism for holding the collet 34A by a vacuum or a mechanism for grasping and holding the collet 34A by a member such as a claw as long as the mechanism can hold the collet 34A.

The voice coil motor 38 further includes an encoder 38d (position information acquiring unit). The encoder 38d obtains, for example, information on the relative position of the movable element 38c relative to the fixed element 38b. This information also corresponds to the protrusion length of the movable element 38c. The information of the encoder 38d is provided to the control unit 20.

That is, the output of the encoder 38d indicates the position along the axis of the movable element 38c relative to the fixed element 38b. Thus, the "position information" mentioned in this embodiment indicates the position along the axis of the movable element 38c relative to the fixed element 38b. Here, the mounting device 1 includes two pickup motors 36A and 36B. Each of the pickup motors 36A and 36B includes the voice coil motor 38. Further, each voice coil motor 38 further includes the encoder 38d. Thus, the mounting device 1 can use the position information obtained from the pickup motor 36A and the position information obtained from the pickup motor 36B.

The collet 34A is provided to straddle the pickup motors 36A and 36B. Thus, it can be regarded that the protrusion length of the movable element 38c of the pickup motor 36A is the same as the protrusion length of the movable element 38c of the pickup motor 36B. Thus, for example, the mounting device 1 may select any one of the position information obtained from the pickup motor 36A and the position information obtained from the pickup motor 36B as representative position information. The representative position information may be calculated by using both the position information obtained from each of the pickup motors 36A and 36B.

The collet 34A holds the semiconductor chip 101 in an attachable and detachable manner. For example, the collet 34A includes a vacuum suction mechanism as an attaching and detaching mechanism. Thus, the collet 34A includes a collet suction hole 34a as a vacuum suction mechanism. One end of the collet suction hole 34a is connected to a pressure source 42. The other end of the collet suction hole 34a is an opening provided in a collet suction surface 34S (chip holding surface). The collet suction surface 34S holds the semiconductor chip 101 in an attachable and detachable manner. For example, when the shape of the chuck holding surface 39a is square, the shape of the collet suction surface 34S is rectangular in the plan view. The area of the collet suction surface 34S is larger than the area of the chuck holding surface 39a. On the other hand, the weight of the collet 34A is smaller than the total weight of the individual collets 34B and 34C (see FIG. 3) respectively provided on the chuck holding surface 39a.

The control unit 20 controls the operation of the pickup unit 30. The operation of the pickup unit 30 described herein includes a suction operation of sucking the semiconductor chip 101 on the collet 34A and a peeling operation of peeling off the semiconductor chip 101 sucked on the collet 34A from a dicing tape 120. The suction operation moves the movable element 38c of the voice coil motor 38 in the −Z direction. The peeling operation moves the movable element 38c of the voice coil motor 38 in the +Z direction. The operation of the movable element 38c is based on the information provided from the encoder 38d. Here, the pickup unit 30 includes two pickup motors 36A and 36B. Thus, the pickup unit 30 includes two encoders 38d. The control unit 20 selects, for example, the pickup motor 36A as a representative motor. That is, the encoder 38d of the pickup motor 36A is selected as a representative encoder. Then, the control unit 20 controls the operation of the pickup unit 30 based on the information provided from the representative encoder 38d.

The criteria selected as a representative may satisfy desired conditions. Further, the control unit 20 may control the operation of the pickup unit 30 using the information provided from the plurality of encoders 38d. For example, the control unit 20 averages the information provided from each encoder 38d. Then, the control unit 20 may control the operation of the pickup unit 30 using the information obtained by averaging.

The pickup head 33 can select a first mode and a second mode in response to the shape of the semiconductor chip 101 to be picked up. The selection of these modes is made by replacing the collets 34A and 34B attached to the chuck 39.

The pickup head 33 can select a mode shown in FIG. 2 as the first mode. The first mode is selected when the surface area of the semiconductor chip 101 is relatively large. Further, the first mode is selected when the thickness of the semiconductor chip 101 is small (thin). In the first mode, the collet 34A straddling two pickup motors 36A and 36B is used.

Figure 3:
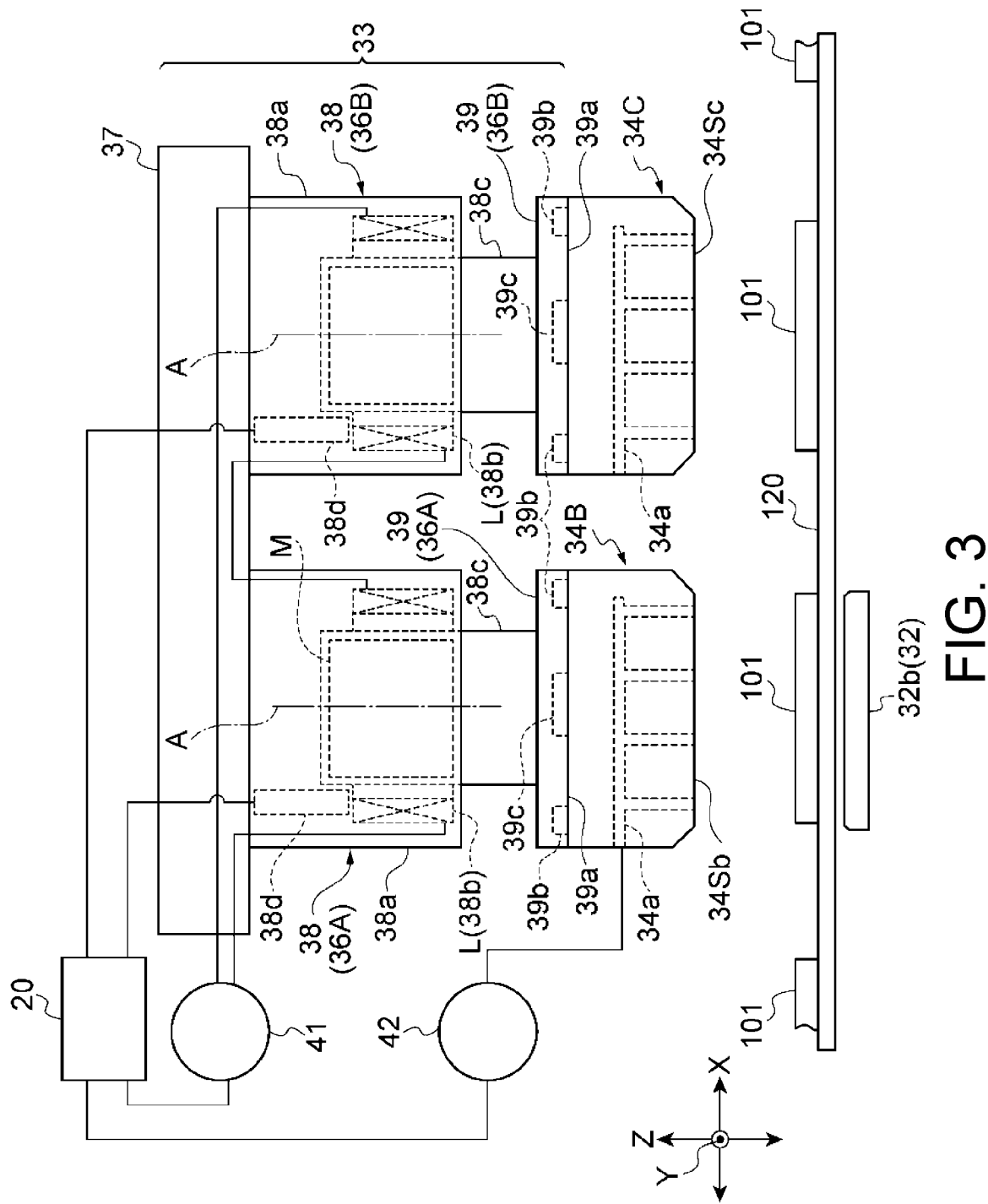
FIG. 3 is a diagram illustrating a second mode of the pickup head.

Further, the pickup head 33 can select a mode shown in FIG. 3 as the second mode. The second mode is selected when the surface area of the semiconductor chip 101 is relatively small. Further, the second mode may be selected when it is necessary to carry many semiconductor chips 101 per unit hour. In the second mode, the collet 34B is attached to the pickup motor 36A and the collet 34C is attached to the pickup motor 36B.

Hereinafter, the operation of the mounting device 1 will be described.

<Pickup Operation>

As shown in (a) of FIG. 4, the control unit 20 moves the pickup unit 30 directly above the semiconductor chip 101 to be picked up. Further, the control unit 20 disposes the push-up pin 32*b* directly below the semiconductor chip 101.

Next, as shown in (b) of FIG. 4, the control unit 20 moves the push-up pin 32*b* in the +Z direction. By this operation, the push-up pin 32*b* pushes up the chip back surface 101*b* of the semiconductor chip 101. As a result, the semiconductor chip 101 approaches the pickup head 33. Next, the control unit 20 moves the collet 34A in the −Z direction. Then, the control unit 20 activates the suction mechanism. As a result, the pickup head 33 sucks the semiconductor chip 101.

Next, as shown in (a) of FIG. 5, the control unit 20 moves the collet 34A in the +Z direction. By this operation, the semiconductor chip 101 is peeled off from the dicing tape 120. Then, the control unit 20 moves the pickup head 33 toward the bonding unit 10. By this movement, the control unit 20 rotates the direction of the pickup head 33. The rotation angle is 180°. By this operation, the direction of the semiconductor chip 101 changes from the downward direction to the upward direction. This operation is a so-called flip chip operation. Additionally, the control unit 20 moves the bonding head 13 toward the pickup unit 30 together with these operations.

Next, as shown in (b) of FIG. 5, the control unit 20 passes the semiconductor chip 101 from the pickup head 33 to the bonding head 13. Then, the bonding head 13 bonds the semiconductor chip 101 to the substrate 110.

Hereinafter, the operation and effect of the mounting device 1 will be described.

The mounting device 1 includes two voice coil motors 38 and the collet 34A. The voice coil motor 38 is a direct-acting linear motor in which the movable element 38*c* reciprocatingly moves along the axis A relative to the fixed element 38*b*. The collet 34A holds the semiconductor chip 101 in an attachable and detachable manner. The voice coil motors 38 are separated from each other in a direction intersecting the axis A. Further, the axes A of the voice coil motors 38 are parallel to each other. The collet 34A is attached to straddle the chucks 39 provided at the end portions of the plurality of movable elements 38*c*.

The mounting device 1 includes two voice coil motors 38 capable of attaching and detaching the collet 34A. According to this configuration, two different modes can be selected. As the first mode, a mode in which one collet 34A is attached to straddle two voice coil motors 38 can be selected. The collet 34A disposed to straddle between the voice coil motors 38 is driven by two voice coil motors 38. Then, the collet 34A can be made larger than, for example, the collets 34B and 34C which can be driven by one voice coil motor 38. That is, the area of the collet suction surface 34S of the collet 34A can be increased. As a result, the area of the chip main surface 101*a* of the semiconductor chip 101 that can be held is increased. Thus, the thin semiconductor chip 101 can be carried. As the second mode, a mode in which the collets 34B and 34C are attached to each of the voice coil motors 38 can be selected. According to the second mode, by being sucked to the collet suction surface 34S*b* of the collet 34B and the collet suction surface 34S*c* of the collet 34C respectively, the small semiconductor chip 101 can be carried. As a result, the mounting device 1 capable of selecting the first mode and the second mode can carry the semiconductor chips 101 of various shapes.

In other words, the mounting device 1 has a configuration in which the collet 34A and the collets 34B and 34C can be exchanged with each other. Thus, the mounting device 1 can handle the semiconductor chips 101 of various shapes. The exchange work of the collets 34A, 34B, and 34C is relatively easier than the exchange work of the voice coil motor 38. That is, when the semiconductor chip 101 to be picked up is changed, large-scale work such as exchange work of the voice coil motor 38 does not occur.

The mounting device 1 can use all pickup motors 36A and 36B of the pickup unit 30 even when the shape of the semiconductor chip 101 to be picked up is changed. For example, as shown in FIG. 6, there is a case in which the semiconductor chip 101 is larger than the gap of the pickup heads 33. In this case, if the semiconductor chip 101 is picked up only using the pickup motor 36A, another pickup motor 36B adjacent to the pickup motor 36A cannot pick up the semiconductor chip 101. This is because the semiconductor chip 101 sucked to the collet 34B interferes with the semiconductor chip 101 sucked to the collet 34C. Thus, even when the pickup unit 30 includes the plurality of pickup motors 36A and 36B, the pickup motor 36B cannot be operated. However, in the mounting device 1 of the embodiment, both the pickup motor 36A and the pickup motor 36B of the pickup unit 30 can be used by selecting the first mode.

The mounting device 1 includes the control unit 20. The control unit 20 controls the position of the fixed element 38*b* by providing a control signal to the voice coil motor 38. The voice coil motor 38 includes the encoder 38*d*. The encoder 38*d* obtains a position along the axis of the movable element 38*c* relative to the fixed element 38*b*. The control unit 20 acquires the representative position information from the encoder 38*d* of the voice coil motor 38 as a representative selected from the plurality of voice coil motors 38. Then, the control unit 20 controls the position of the movable element 38*c* of the voice coil motor 38 using the representative position information. According to this configuration, the position of the movable element 38*c* of the voice coil motor 38 can be simply controlled with high accuracy. Thus, the position of the collet 34A provided in the pickup motors 36A and 36B can be simply controlled with high accuracy.

The movable element 38*c* is provided with the chuck 39. The chuck 39 includes the chuck magnet 39*b* and the chuck sensor 39*c*. The collet 34A is connected to the chuck 39 in an attachable and detachable manner. The chuck magnet 39*b* connects the collet 34A to the chuck 39. The chuck sensor 39*c* detects whether or not the collet 34A exists in the chuck 39. According to this configuration, the collet 34A can be easily attached to and detached from the movable element 38*c*. Further, it is possible to obtain information indicating that the collet 34A is attached to the movable element 38*c* and information indicating that the collet 34A is not attached to the movable element 38*c*.

The collet 34A includes the collet suction surface 34S that holds the semiconductor chip 101 in an attachable and detachable manner. The semiconductor chip 101 includes the chip main surface 101*a* held by the collet suction surface 34S. The area of the collet suction surface 34S is larger than the area of the chip main surface 101*a*. According to this configuration, the thin semiconductor chip 101 can be reliably held.

The mounting device 1 further includes the push-up pin 32*b*. The push-up pin 32*b* pushes up the semiconductor chip 101 toward the collet 34A by pushing the chip back surface 101*b* on the side opposite to the chip main surface 101*a*. According to this configuration, the collet 34A can reliably pick up the semiconductor chip 101.

As described above, the mounting device of the disclosure has been described. However, the mounting device of the disclosure may be implemented in various forms without being limited to the above-described embodiment.

In the above-described embodiment, the pickup unit 30 includes two pickup heads 33. The number of the pickup heads 33 of the pickup unit 30 is not limited to two. For example, the pickup unit 30 may include four pickup heads 33. In this case, the pickup heads 33 may be arranged in a linear shape or may be arranged in a two-dimensional shape. Then, the collet 34A may be disposed to straddle two pickup heads 33 or four pickup heads 33 in four pickup heads 33.

The invention claimed is:

1. A mounting device, comprising:
a plurality of pickup heads which are capable of moving independently, and respectively have a motor of direct-acting type in which a movable element reciprocatingly moves along an axis relative to a fixed element;
a chip holder which is attached to an end portion side of the pickup heads and includes a collet suction hole as a vacuum suction mechanism to suck and hold a semiconductor chip; and
a control unit which provides a control signal to the motor to control a position of the fixed element,
wherein the plurality of the pickup heads are arranged in a manner that the axes are parallel to each other, and
wherein the chip holder is attached to straddle end portion sides of at least two pickup heads in the plurality of the pickup heads,
wherein the semiconductor chip includes a chip held surface which is held by the chip holder,
the chip holder includes a chip holding surface which holds the semiconductor chip in an attachable and detachable manner, and
wherein an area of the chip holding surface is larger than an area of the chip held surface,
wherein the motor includes a position information acquiring unit which obtains a position along the axis of the movable element relative to the fixed element, and
wherein the control unit acquires representative position information from the position information acquiring unit of a representative motor selected from the plurality of motors and controls the positions of the plurality of the pickup heads using the representative position information.

2. The mounting device according to claim 1,
wherein the motor is a voice coil motor.

3. The mounting device according to claim 1,
wherein each of the plurality of the pickup heads further includes a chuck which is provided at an end portion of the movable element and to which the chip holder is connected in an attachable and detachable manner, and
wherein the chuck includes a chuck mechanism which connects the chip holder to the chuck and a chuck detector which detects whether or not the chip holder exists in the chuck.

4. The mounting device according to claim 1,
wherein the mounting device further comprises a push-up mechanism which pushes a surface on the side opposite to the chip held surface and pushes up the semiconductor chip toward the chip holder.

\* \* \* \* \*